(12) United States Patent
Kamiguchi et al.

(10) Patent No.: US 7,440,239 B2
(45) Date of Patent: Oct. 21, 2008

(54) MAGNETO-RESISTANCE EFFECT ELEMENT AND REPRODUCING HEAD

(75) Inventors: Yuzo Kamiguchi, Kanagawa-Ken (JP); Masayuki Takagishi, Kanagawa-Ken (JP); Yuichi Ohsawa, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1165 days.

(21) Appl. No.: 10/671,586

(22) Filed: Sep. 29, 2003

(65) Prior Publication Data
US 2004/0061590 A1 Apr. 1, 2004

(30) Foreign Application Priority Data
Sep. 30, 2002 (JP) .............................. 2002-287701

(51) Int. Cl.
*G11B 5/127* (2006.01)
(52) U.S. Cl. .............................. 360/324.11; 360/324.12
(58) Field of Classification Search ............ 360/324.11, 360/324.12
See application file for complete search history.

(56) References Cited

U.S. PATENT DOCUMENTS

| 6,295,186 | B1 * | 9/2001 | Hasegawa et al. | 360/324.11 |
| 6,700,761 | B2 * | 3/2004 | Ihara et al. | 360/327 |
| 6,778,364 | B2 * | 8/2004 | Dobisz et al. | 360/324.12 |

* cited by examiner

*Primary Examiner*—Andrea Wellington
*Assistant Examiner*—Carlos E Garcia
(74) *Attorney, Agent, or Firm*—Oblon, Spivak, McClelland, Maier & Neustadt, P.C.

(57) ABSTRACT

It is possible to obtain sensitivity which can achieve an excellent error rate with a high recording density. There are provided a magnetization free layer which has two opposed main surfaces, one of which is set to be generally parallel to an air bearing surface; an intermediate layer which is formed on an opposite side face of the magnetization free layer from a medium to come in contact with the magnetization free layer; and a pair of magnetization pinned layers which are formed on an opposite side face of the intermediate layer from the magnetization free layer to come in contact with the intermediate layer and extend outwardly. A sense current flows from one magnetization pinned layer to the other magnetization pinned layer through the magnetization free layer.

19 Claims, 8 Drawing Sheets

MAGNETO-RESISTANCE EFFECT ELEMENT AND REPRODUCING HEAD

CROSS-REFERENCE TO RELATED APPLICATIONS

This application is based upon and claims the benefit of priority from prior Japanese Patent Application No. 2002-287701, filed on Sep. 30, 2002 in Japan, the entire contents of which are incorporated herein by reference.

BACKGROUND OF THE INVENTION

1. Field of the Invention

The present invention relates to a magneto-resistance effect head used in a magnetic recording system and a magneto-resistance effect element.

2. Related Art

In some kinds of ferromagnetic substance, a phenomenon where an electric resistance varies according to intensity of an external magnetic field has been known, and it is called "magneto-resistance effect". This effect can be used for detecting an external magnetic field, and such a magnetic field detecting element or device is called "a magneto-resistance effect element" (hereinafter, referred to as an "MR element").

Such an MR element is used for reading of information or data stored in a magnetic recording medium in a magnetic recording apparatus such as a hard disc, a magnetic tape or the like in an industrial field, and such a magnetic head is called "an MR head".

In recent years, in a magnetic recording apparatus utilizing these MR elements, particularly, in a hard disc, a densification of a magnetic recording density is forwarded, a size of one bit is made small, and an amount of leakage magnetic flux from the bit is reduced increasingly. For this reason, it is made essential for reading of information or data written in a magnetic medium to manufacture an MR element with a high sensitivity and a high S/N ratio which can achieve a large resistance change rate even in a low magnetic field, which constitutes an important fundamental technique for improving a recording density.

Here, the high sensitivity means that a resistance change amount ($\Omega$) per unit magnetic field (Oe) is large. The larger resistance amount and the more excellent soft magnetic characteristic an MR element has, the higher sensitivity the MR element has. Further, in order to realize a high S/N ratio, it becomes important to reduce thermal noises as much as possible. For this reason, it is not preferable that an element resistance itself becomes excessively large. When the element is used as a sensor for reading a hard disc, it is desired in order to realize an excellent S/N ratio that the element resistance is a value in a range of $10\Omega$ to $200\Omega$.

Under such a background, it currently becomes common to use an MR element having a spin valve film which can obtain a large MR ratio as the MR element used in an MR head for a hard disc. The spin valve film is a film in which one ferromagnetic layer (also called "a magnetization pinned layer") of two ferromagnetic layers which are put in a magnetically non-coupling state via an intermediate layer of non-magnetic material has magnetization fixed by exchange bias using an anti-ferromagnetic layer and the other ferromagnetic layer (called "a magnetization free layer") can be put in a state where it can be easily magnetization-rotated by an external magnetic field(signal magnetic field or the like), so that a relative angle between the magnetization directions of the two ferromagnetic layers is varied by rotating only the magnetization of the magnetization free layer by an external magnetic field, thereby obtaining a large magneto-resistance effect (refer to, for example, Phys. Rev. B45, 806 (1992), and J. Appl. Phys. 69, 4774 (1991)). Since the spin valve film can rotate the magnetization in a low magnetic field, a high sensitization is possible and is suitable for an MR element for an MR head.

At present, a system which causes a sense current to flow from one electrode to the other electrode in parallel with a film face of a magneto-resistance effect film to such a spin valve film to measure a resistance in a direction parallel to the film face is commonly used. This system is generally called "a CIP (Current In Plane) system.

In this CIP system, the MR ratio can reach a value in a range of about 10% to 20%. In a current MR head of a shield type which is used commonly, since the spin valve film is used with a shape approximating to a regular square, the resistance of the MR element becomes approximately equal to a sheet resistance of the spin valve film. For this reason, in the spin valve film in the CIP system, it is possible to achieve an excellent S/N characteristic by setting the sheet resistance to $10\Omega$ to $30\Omega$. This can be realized relatively easily by making the film thickness of the whole spin valve film thinner. In view of these merits or advantages, the spin valve film of the CIP system is commonly used as the MR element for a MR head at present.

However, for the purpose of realizing information reproduction with such a high recording density as exceeding 500 Gbpsi (Gigabit per square inch), it is prospected that the MR ratio must reach a value exceeding 50%. On the other hand, it is difficult to achieve a value exceeding 20% as the MR ratio in a conventional spin valve film. For this reason, it is a large technical problem to be solved for further improving a recording density to achieve how to make the MR ratio large.

As means for solving such a technical problem, a method which causes a sense current to flow from one electrode to the other electrode perpendicularly to a film face of a magneto-resistance effect film to measure a resistance, in the direction perpendicular to the film face, of the magneto-resistance effect film is known. This method is generally called "CPP (Current Perpendicular to Plane) system. MR elements used in the CPP system are largely classified to three kinds. The first one of the kinds has a structure that non-magnetic metal is used for an intermediate layer, which is generally called "a CPP-spin valve film". The second one has a structure that insulator is used for an intermediate layer, which is generally called "a magnetic tunnel MR film". The third one has a structure where an intermediate layer is constituted by contact points between magnetic substances, which is generally called "a point contact MR film".

In the CPP system, an operation principle is based upon that a large MR ratio is obtained by utilizing the fact that a conductance between two magnetic layers joined via (1) non-magnetic metal, (2) insulator or (3) contact points is changed in response to a change of a relative angle in magnetization between the two magnetic layers. That is, it is made possible to cause a current to flow in a direction perpendicular to a magnetic layer/an intermediate layer/a magnetic layer to cause most of the current to cross the same, thereby utilizing an excellent interface effect. For this reason, it is known that a large MR ratio exceeding 50% can be obtained in the above three elements in principle. Therefore, it is essential to use a magneto-resistance effect element of the so-called CPP system in an MR head corresponding to a high magnetic recording density exceeding 500 Gbpsi.

Among them, the CPP-spin valve film having a possibility that a low resistance and a large MR ratio are compatible with each other is attracting as an MR element for a head. Incidentally, it is necessary to maintain the thickness of the magnetic layer in a range of about 5 nm or less in this structure. When such an extremely thin magnetic layer is used, conductive electrons which have not been polarized in spin and have been injected from an electrode into a magnetic layer pass through the magnetic layer before they have been polarized in spin. As a result, there exists such a problem that it becomes difficult to obtain a sufficient MR ratio due to lack in spin polarization of conductive electrons.

Further, in the CPP-spin valve film, the resistance of an anti-ferromagnetic layer which contributes to only increase in element resistance but does not contribute to a spin-dependent resistance causing MR change is connected to an entire current path in series, so that the resistance causes increase in element resistance and decrease in MR ratio when judgement is made as the whole element.

In order to use the CPP-spin valve film as the MR element for a head, it is necessary to solve the above two problems.

On the other hand, as the structure for the MR head, a shield type MR head where an MR element is provided so as to be opposed to a medium between shields enters a mainstream. In such a shield type MR head, however, there are some problems, and it is therefore considered that it is difficult to use the head at a recording density equal to 500 Gbpsi or more.

One of the problems is a problem about a gap distance or interval, where a line recording density is defined by a gap distance between shields in the shield type MR head, but it is necessary to set the gap distance to be extremely fine such as 30 nm or less in case of a high density exceeding 400 Gbpsi. Therefore, it becomes much difficult to sandwich or insert a MR element in such a fine gap. This is because the thickness of only the MR element has a value close to 20 nm.

The second of the problems is a problem of a depth process, where a depth of an MR element is determined by polishing in the shield type MR head at the final stage. It is necessary to control the depth of the MR element with accuracy of 10 nm or less after polishing run-in in a case of high density exceeding 500 Gbpsi. However, it is not easy to achieve such accuracy by machining.

As described above, in a high recording density exceeding 500 Gbpsi, it is essential to use a CPP-MR element which can obtain a large MR ratio by conducting a current in a direction perpendicular to a film face of a magneto-resistance effect film. In particular, it is expected that the CPP-spin valve element from which a high MR ratio can be expected with a low resistance is used while avoiding the problems therein.

Moreover, a novel MR head structure provided with a fine resolution replaced for the shield type MR head is required in order to meet the high density recording exceeding 500 Gbpsi.

On the other hand, regarding the perpendicular magnetic recording, there is such a problem as described below.

In generally, a record reproducing system in a current magnetic recording apparatus employs a longitudinal recording system. In the longitudinal recording system, there will occur such a problem that demagnetization field becomes larger according to increase in recording density, which results in lowering of reproduction output and failure in stable recording. A perpendicular recording system has been proposed as means for solving such a problem. In this perpendicular recording system, magnetization and recording are conducted in a direction perpendicular to a recording medium face, where, even if a recording density is increased as compared with the longitudinal recording, influence of demagnetization field is reduced and lowering of reproducing output or the like is suppressed. Therefore, the perpendicular recording system has been regarded as importance.

The longitudinal recording and the perpendicular recording are different in reproducing wave shape which has not been subjected to a signal processing yet. When a signal processing for reproduction is carried out using the perpendicular recording, it is necessary to modify the reproduction signal processing technique of the longitudinal recording which has been cultivated by this time. The modification methods will be classified roughly to two methods, one method which includes conducting a differential processing on a raw reproduction waveform to form a single peak waveform like the case of the longitudinal recording and thereafter using the signal processing technique for the longitudinal recording, and the other method which includes establishing a technique for the perpendicular recording totally. The former method is easier than the latter method, but such a possibility becomes high that the former is inferior in error rate to the latter.

Even if a signal processing is conducted by either method in the perpendicular recording system, it is necessary to sharpen a raw reproduction waveform in order to achieve a high recording density. As an index indicating sharpness of a reproducing waveform, PW 50 showing a half width is used in case of a single-humped wave such as a differentiated wave in the longitudinal recording system or the perpendicular recording system and T50 (a time period from 25% output to 75% output) is used in case of a monotone wave like the perpendicular recording. This value is controlled to about 2.0 to 3.0×bit length in the case of PW50, and it is controlled to 1.4 to 2.0×bit length or the like in the case of T50 so that a desired error rate is obtained. The value largely depends on a reproduction gap length. Therefore, in order to make line density large, that is, make a bit length small, it is necessary to make the reproducing gap length small.

However, making the reproduction gap small is approaching to a limitation. A total film thickness of a magneto-resistance effect film used in a product level has at least 20 nm or so at present, and when the thickness of an insulating layer is added to the total film thickness, the limitation of the reproduction gap will be 50 nm at present. Even if it is assumed that a withstand voltage of the insulating layer becomes large or a CPP element or the like is used, the limitation of the reproduction gap is considered to be 30 nm, so that an application limitation of a current shield type will be estimated to be 400 Gbpsi or so. In order to achieve a further high recording density exceeding this limitation, if the reproducing head of the current shield type is used, it is considered that a breakthrough of a signal processing system or the like will be required.

On the other hand, a reproducing head of a yoke type has been conventionally considered as a reproducing head where no shield is used. The reproducing head of the yoke type is constituted such that magnetic flux from a medium is prevented from flowing into a magneto-resistance effect element directly by spacing ABS (air bearing surface), or a medium opposing face and the magneto-resistance effect element from each other, a soft magnetic substance (in many cases, a pair of magnetic substance) called "a yoke" is exposed to the ABS, and the ABS is connected to the magneto-resistance effect element so that magnetic flux is led to the magneto-resistance effect element. Thereby, it is considered that sensitivity is concentrated to the vicinity of an exposed portion of the yokes at the ABS so that a reading resolution is improved and differentiation of the yokes provided in the paired manner serves so that the resolution is increased. Further, since the magneto-resistance effect film portion does not have sensitivity directly, a magneto-resistance effect element section can be made large, which results in merit in manufacture.

Furthermore, the differentiation in the yokes influences a reproduction waveform like the differentiating circuit in a reproduction signal processing. In particular, when the reproducing head of the yoke type is used in a perpendicular magnetic recording, it becomes a single peak wave in the same manner that the shield type reproducing head is used in the longitudinal recording system. For this reason, it is considered that the same reproduction signal processing system as the conventional longitudinal recording system can be used without using a differentiating circuit.

However, as the result of eager studying, it has been found that the reproducing head of the yoke type actually has some sensitivity even at its portion spaced from the ABS, and in particular, when the reproducing head is used in the perpendicular recording system, there is a defect that a resolution having such a degree that a predetermined error rate can be obtained can not be obtained. In case that the yoke type head is used in the perpendicular recording system, magnetic flux sensing by the yoke when there is a gap in a magnetization transition point becomes maximum and a reproduction waveform forms a single-humped wave. When the gap deviates from the magnetization transition point, an output is principally expected to become zero. However, it has been found from the result of research that because magnetic flux from the medium reaches an upper portion of the yoke spaced from the ABS face, a spatial resolution is remarkably lowered.

SUMMARY OF THE INVENTION

The present invention has been made in view of the above-described circumstances, and an object thereof is to provide a magneto-resistance effect element provided with sensitivity which can achieve an excellent error rate with a high recording density.

A magneto-resistance effect element according to a first aspect of the present invention includes: a magnetization free layer which has two opposed main surfaces, one of which is set to be generally parallel to an air bearing surface; an intermediate layer which is formed on an opposite side face of the magnetization free layer from a medium to come in contact with the magnetization free layer; and a pair of magnetization pinned layers which are formed on an opposite side face of the intermediate layer from the magnetization free layer to come in contact with the intermediate layer and extend outwardly, a sense current flowing from one magnetization pinned layer to the other magnetization pinned layers through the magnetization free layer.

The magnetization pinned layer can be connected with an electrode for a sense current.

The magnetization pinned layers can be larger in area than the magnetization free layer.

Connection positions of the magnetization pinned layer and the magnetization pinned layers can be spaced 10 nm or more from connection positions of the magnetization pinned layers and the electrode for a sense current.

The magneto-resistance effect element can further includes a first oxide layer formed on the air bearing surface of the magnetization free layer directly or via a layer comprising any one of Au, Ag and Cu, or an alloy layer of any one of Au, Ag and Cu, wherein the first oxide layer has an electron reflection effect.

Magnetization directions of the magnetization free layer and the magnetization pinned layers can cross generally perpendicularly to each other.

The width of the magnetization free layer can be generally coincident with a recording track width.

A reproducing head according to a second aspect of the present invention includes: a magneto-resistance effect element described above, wherein a distance between an air bearing surface of the head and a bottom face of the magnetization free layer is 30 nm or less.

A reproducing head according to a third aspect of the present invention includes: a magneto-resistance effect element described above, wherein the length of the magnetization free layer is within three times the shortest bit length in a track direction of the medium.

EMBODIMENTS OF THE INVENTION

Embodiments of the present invention will be explained with reference to the drawings.

Figure 1A:
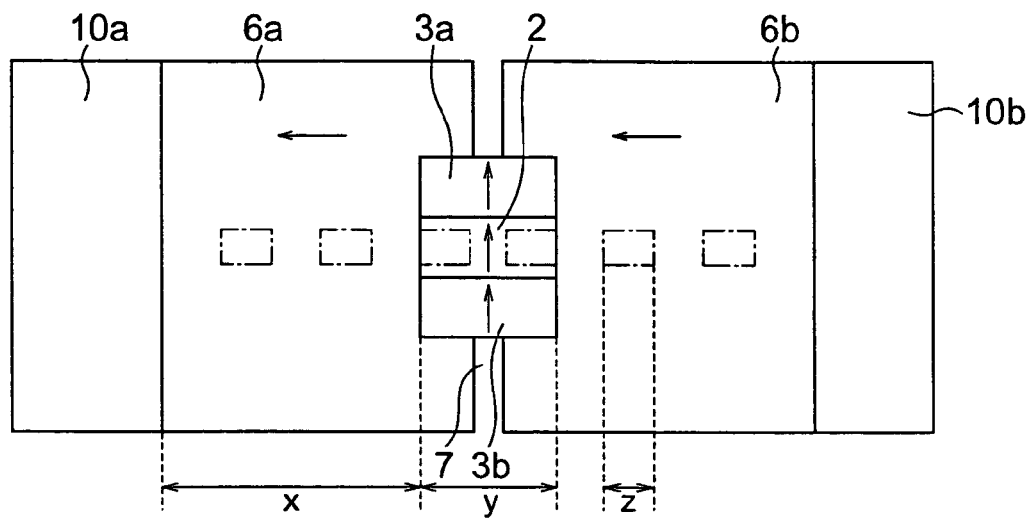
FIGS. 1A and 1B are a bottom view and a sectional view showing a constitution of a magneto-resistance effect element according to an embodiment of the present invention.
Figure 1B:
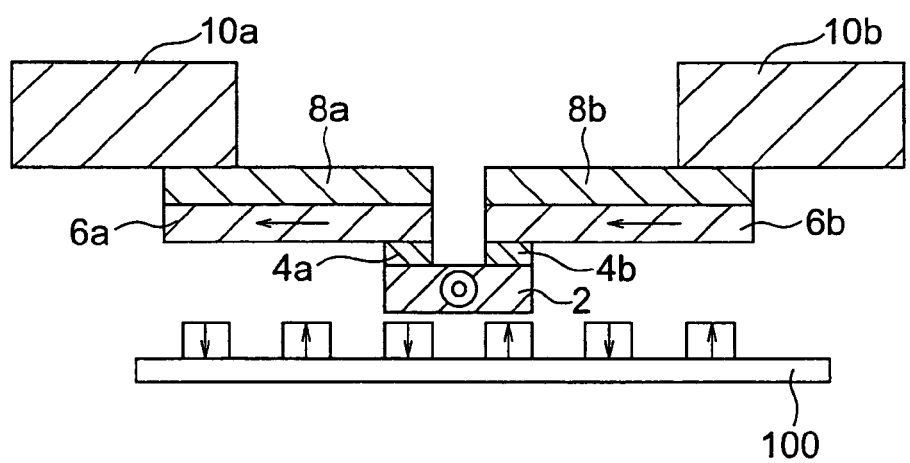

A bottom view of a magneto-resistance effect element according to one embodiment of the present invention is shown in FIG. 1A and a sectional view thereof is shown in FIG. 1B. A magneto-resistance effect element according to this embodiment is provided with a magnetization free layer 2 opposed to a patterned perpendicular medium 100 generally in parallel thereto, two magnetization pinned layers 6a and 6b connected to both sides of an opposite face of the magnetization free layer 2 from the medium 2 via intermediate layers 4a and 4b so as to extend outwardly, and electrodes 10a and 10b connected to the magnetization pinned layers 6a and 6b via anti-ferromagnetic layers 8a and 8b. Magnetization of the magnetization pinned layers 6a and 6b are fixed by the anti-ferromagnetic layers 8a and 8b and magnetization of the magnetization free layer 2 is made to a single magnetic domain by hard films 3a and 3b. The magnetization of the magnetization free layer 2 and the magnetizations of the magnetization pinned layers 6a and 6b are arranged so as cross at a right angle. In such a magnetization arrangement, since the magnetization of the magnetization free layer 2 rotates due to entrance of signal magnetic flux from the patterned perpendicular medium 100 in the magnetization free layer 2, a relative angle between the magnetizations of the magnetization pinned layers 6a and 6b and the magnetization of the magnetization free layer 2 varies from a generally perpendicularly crossing state. Incidentally, it is preferable that the width of the magnetization free layer 2 is generally equal to a recording track width of the medium 100. Further, as shown in FIG. 1A, it is preferable that the length y of the magnetization free layer 2 is within three times the shortest bit length z in a track direction of the medium 100.

Since the magnetizations of the magnetization pinned layers 6a and 6b are fixed by the anti-ferromagnetic layers 8a and 8b, they are not influenced by a reproduction sensitivity and a resolution is determined by the shape of the magnetization free layer 2. For this reason, a spatial resolution which can accommodate a recording density of 500 Gbpsi can be obtained by prescribing the shape of the magnetization free layer 2.

The reproducing head of the yoke type has a merit that its magneto-resistance effect film does not have any sensitivity to magnetic flux from the medium, but the head having the magneto-resistance effect element according to the present embodiment has a feature that the magnetization free layer 2 of the magneto-resistance effect film is provided at a position where it has a direct sensitivity to magnetic flux from the medium 100.

It is necessary to provide the magnetization free layer 2 at the position where it has a direct sensitivity. In particular, a distance (a magnetic spacing) from the medium 100 to the magnetization free layer 2 influences a spatial resolution directly. When the magnetic spacing exceeds two times the bit length, the spatial resolution deteriorates urgently, so that it is necessary to suppress a distance from an ABS (Air Bearing Surface) to the magnetization free layer 2. Since the bit length is currently 30 nm or so, the distance from the ABS to the magnetization free layer 2 must be suppressed in a range of at most 30 nm in view of a physical floating amount. It is preferable that the distance is set to 10 nm or so.

At that time, a sense current flows from the electrode 10a to the magnetization pinned layer 6a via the anti-ferromagnetic layer 8a, it flows from the magnetization pinned layer 6a to the magnetization free layer 2 via the intermediate layer 4a, it flows from the magnetization free layer 2 to the magnetization pinned layer 6b on the opposite side via the intermediate layer 4b, and it flows from the magnetization pinned layer 6b to the electrode 10b via the anti-ferromagnetic layer 8b. Therefore, the sense current consequently passes through the interfaces between the magnetization pinned layers 6a and 6b and the magnetization free layer 2 twice. At that time, it is made possible to obtain a large reproduction output by a large interface magneto-resistance effect and a large CPP-MR effect.

As the CPP-MR effect, any of a CPP-spin valve effect, a magnetic tunnel MR effect, and a magnetic point contact MR effect can be used. However, in a high density recording system where a recording density exceeds 500 Bbpis, it is desirable to use a MR element having a CPP-spin valve film where a large MR ratio can be expected with a low resistance. Incidentally, an intermediate layer of the magneto-resistance effect element using the CPP-spin valve effect is a non-magnetic layer, an intermediate layer of the magneto-resistance effect element using the magnetic tunnel MR effect is an insulating layer (a tunnel barrier layer), and an intermediate layer of the magneto-resistance effect element using the magnetic point contact MR effect is a magnetic substance layer.

In this structure, when the CPP-spin valve film is used, even if a thin magnetization free layer 2 with a thickness of 5 nm is used, a current flows in a horizontal direction of a film face within the magnetization free layer 2. For this reason, it is made possible that a current utilizes a spin-dependent bulk scattering within the magnetization free layer 2 over a sufficiently long distance, so that a large MR ratio can be obtained.

On the other hand, in case that a thin magnetization free layer is used in an ordinary CPP film, since a current passes through a film in a direction perpendicular to film face with a short distance, a sufficiently large spin-dependent bulk scattering effect can not be utilized, which results in reduction of the MR ratio.

In the structure of the present embodiment, however, in case that the CPP-spin valve film is used, since a current path is formed in an in-plane direction of the magnetization pinned layer after a current is injected from the electrode into the magnetization pinned layer, it is made possible to spin-polarize a current sufficiently while it is flowing in the in-plane even in case that a thin magnetic layer is used. For this reason, such a risk occurring in a case of a simple CPP spin valve structure, that the lack in spin polarization makes electrons injected from the electrode into the thin magnetic layer pass through the magnetic layer before they are polarized in spin is solved, so that a large magneto-resistance effect can be obtained using the thin magnetic layer while keeping a high magnetic field sensitivity. For this reason, it is preferable that a distance x between an edge of the magnetization free layer 2 and an edge of the sense current lead 10a is 10 nm or more. Also it is preferable that a distance x between an edge of the magnetization free layer 2 and an edge of the sense current lead 10b is 10 nm or more (see FIG. 1A).

Further, resistances of the anti-ferromagnetic layers 8a and 8b which contribute to only increase in element resistance but does not contribute to the spin-dependent resistance do not constitute a serial connection in the vicinity of the magnetization free layer 2 but they serve as a parallel connection from the electrodes 10a and 10b, so that suppression to a small contribution to the resistance can be made and both a small element resistance and a large MR ratio can be achieved.

For this reason, it is desirable to employ such a constitution that the areas of the respective film faces of the magnetization pinned layers 6a and 6b are made large relative to the area of the film face of the magnetization free layer 2, so that current convergence is caused in the vicinity of the magnetization free layer 2 so that a resistance of a connection interface contributing to the MR ratio is sensed efficiently.

In the magneto-resistance effect element according to this embodiment, Ni, Co, Fe and alloy thereof can be used as material for the magnetization pinned layer 6a, 6b. In particular, it is desirable to use NiFe alloy or CoFe alloy in view of the MR ratio. Further, in order to improve a spin polarization rate in an interface, a stacked structure comprising NiFe/CoFe, NiFe/Co, NiFe/Fe or the like can be used. Moreover, in order to improve a magnetization fixing characteristic of the magnetization pinned layer 6a, 6b, a so-called synthetic anti-ferromagnetic structure such as CoFe/Ru/CoFe stacked structure can be used. Furthermore, half metal may be used for realizing a further high resistance change rate. As the half metal, Heuslar alloy such as NiMnSb, PtMnSb or the like, oxide magnetic material such as $CrO_2$ or the like, or an diamond structural material such as perovskite base half metal, CrAs or the like can be used.

Further, the anti-ferromagnetic layer 8a, 8b for magnetization fixation, anti-ferromagnetic material such as PtMn, NiMn, IrMn or the like can be used. In addition, insulating anti-ferromagnetic material such as NiO may be used.

Incidentally, as the magnetization free layer 2, materials similar to ones described in the magnetization pinned layer 6a, 6b can be used.

In case that a magnetic tunnel effect is used in the CPP-MR element, it is desirable to use an oxide barrier as the intermediate layer 4a, 4b. Specifically, an insulating material with high gap energy such as $Al_2O_3$, $SiO_2$ or the like can be used. Incidentally, in order to suppress increase in element resistance, it is desirable that the film thickness of the intermediate layer 4a, 4b is set to 2 nm or less. Further, as the barrier, oxide such as NiO with a small gap energy or the like may be used.

Further, in case that the CPP-spin valve effect element is used in the CPP-MR element, it is desirable that a non-magnetic metal layer is used as the intermediate layer 4a, 4b. Specifically, rare metal such as Au, Ag, Cu and the like, and alloy thereof, or a stacking structure thereof can be used as the non-magnetic metal layer. Both decoupling of excellent magnetic coupling and transmission of spin polarization can be made possible by setting the film thickness of the intermediate layer 4a, 4b to 1 nm to 10 nm or so.

Moreover, in case that the magnetic point contact effect is used in the CPP-MR element, fine magnetic structure with a diameter of at most 10 nm can be used as the intermediate layer 4a, 4b. As the material for the magnetic structure, one similar to the materials described regarding the magnetization pinned layer 6a, 6b and the magnetization free layer 2 can be used.

Figure 2:
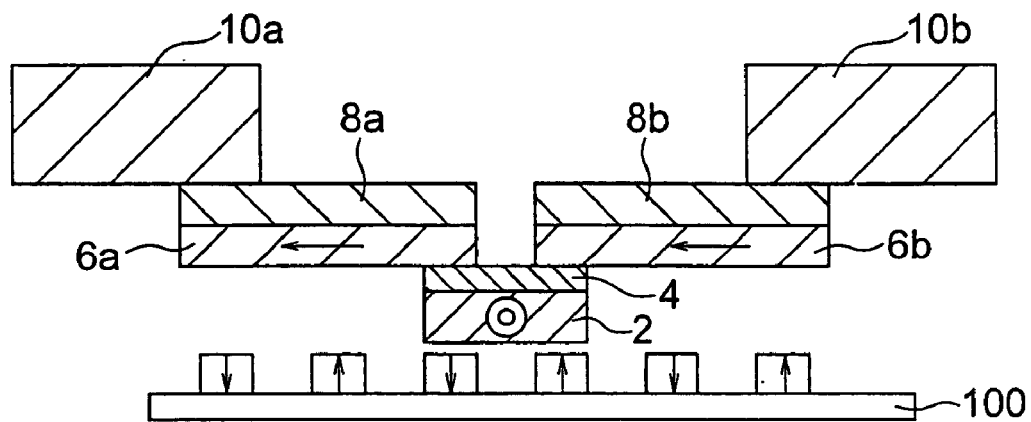
FIG. 2 is a sectional view showing a constitution of a magneto-resistance effect element according to a first modified embodiment.
Figure 3:
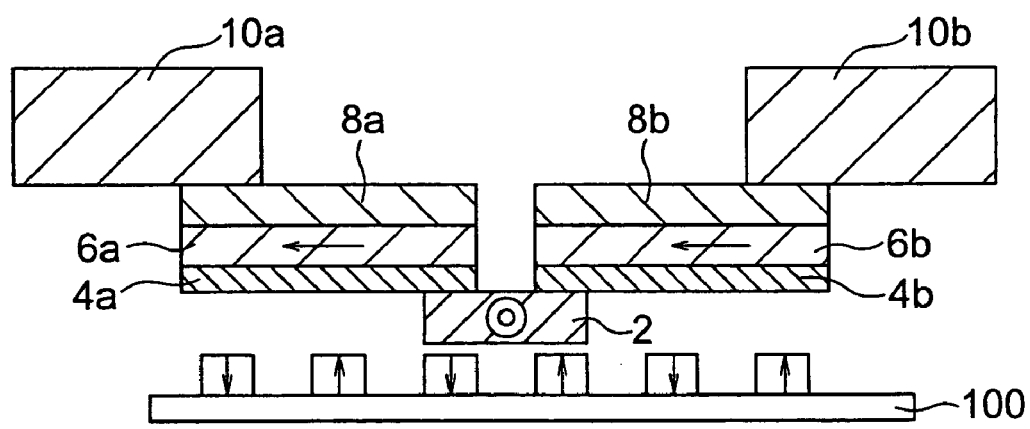
FIG. 3 is a sectional view showing a constitution of a magneto-resistance effect element according to a second modified embodiment.
Figure 4:
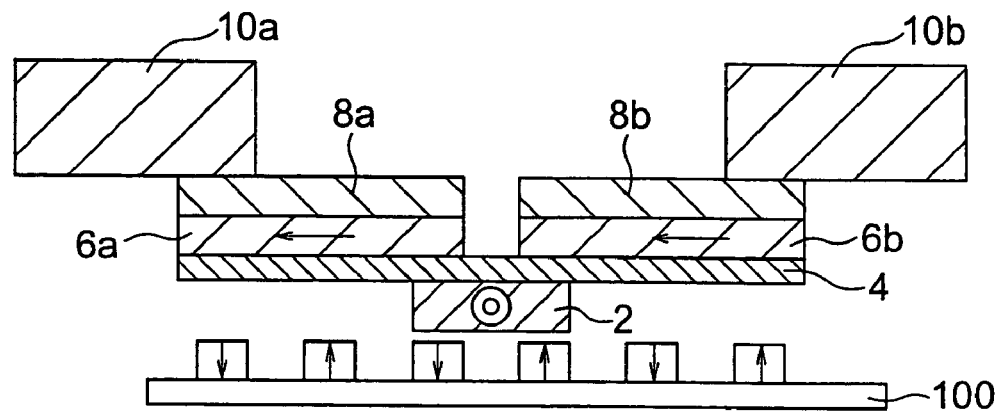
FIG. 4 is a sectional view showing a constitution of a magneto-resistance effect element according to a third modified embodiment.

Incidentally, as shown in FIG. 2, the intermediate layer 4 may be stacked on the whole magnetization free layer 2, as shown in FIG. 3, the intermediate layer 4a, 4b may be stacked on the whole magnetization pinned layer 6a, 6b, and as shown in FIG. 4, the intermediate layer 4 may be provided so as to span over both the magnetization pinned layers 6a and 6b. Incidentally, as shown in FIGS. 1A and 1B, it is most desirable that the intermediate layers exist at only portions joined to the magnetization free layer 2.

The reason is because, in the structures shown in FIG. 2, FIG. 3, and FIG. 4, since all currents do not flow in an interface between the magnetic substance and the non-magnetic substance, the MR ratio is slightly decreased. However, it is possible to obtain an output which can sufficiently be used as a reproducing head. Since it is possible to pattern the magnetization free layer 2 and the intermediate layer 4 in a lump in FIG. 2, there occurs such a merit that a manufacturing process can be simplified. Similarly, since the magnetization pinned layers 6a and 6b and the intermediate layers 4a and 4b can be patterned in a lump in FIG. 3, simplification of a manufacturing process can be made possible. Such a structure as shown in FIG. 4 can be employed depending on a manufacturing method to be applied.

Figure 5:
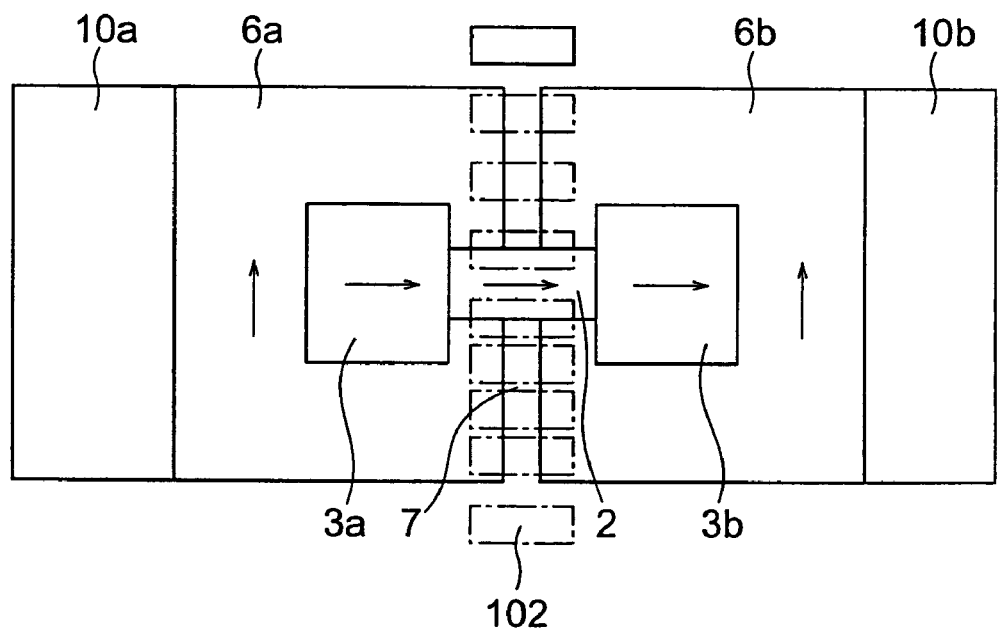
FIG. 5 is a sectional view showing a constitution of a magneto-resistance effect element according to a fourth modified embodiment.

The direction of the magnetization may be arranged as shown in FIGS. 1A and 1B, but it may be arranged as shown in FIG. 5. In a structure shown in FIG. 5, arrangement of magnetization is rotated 90° from the structure shown in FIGS. 1A and 1B. A track direction of a medium 100 has a positional relationship rotated 90° from the structure shown in FIGS. 1A and 1B. By employing such a structure, the following merit can be obtained.

The merit is that the magnetization fixing directions of the magnetization pinned layers 6a and 6b and the direction of a groove 7 at a central portion spanned between the magnetization pinned layers 6a and 6b are parallel with each other, and they extend in the track direction. With such a constitution, stray (leakage) magnetic flux does not occur in the groove portion 7 due to magnetization of the magnetization pinned layers 6a and 6b, so that extra external magnetic field is prevented from being applied to the magnetization free layer 2. On the other hand, in the structure shown in FIGS. 1A and 1B, since the direction of the groove 7 which the magnetization free layer 2 spans and the magnetization fixing directions of the magnetization pinned layer 6a and 6ba cross each other at a right angle, magnetic fields crossing perpendicularly to each other occur at a portion of the groove 7. For this reason, since the magnetization free layer 2 positioned in the groove 7 is influenced by a mixed magnetic field, it is necessary to pay attention to a design.

Further, in case that a shape of one bit on the medium 102 is considered, when the size of the shape in a direction of a track width is larger than the size in a direction of the track, the shape of the magnetization free layer 2 has a longer side in the width direction, so that it is made easy to span the groove 7. As a result, the structure shown in FIG. 5 is made easier in manufacture than that shown in FIGS. 1A and 1B.

In case that the magneto-resistance effect head according to this embodiment is used in the perpendicular recording system, a reproduction waveform of a single-humped wave is formed, which results in much convenience in reproduction signal processing. Further, the head does not have a large yoke, a resolution remarkably more excellent than that in the reproducing head of the yoke type can be achieved.

A reproduction principle of the magneto-resistance effect element according to this embodiment is shown in FIGS. 6A, 6B, 6C and 6D. In the magneto-resistance effect element according to this embodiment, an output reaches the maximum at a position of the magnetization transition point, and any output does not occur at any position except the magnetization transition point.

Figure 6A:
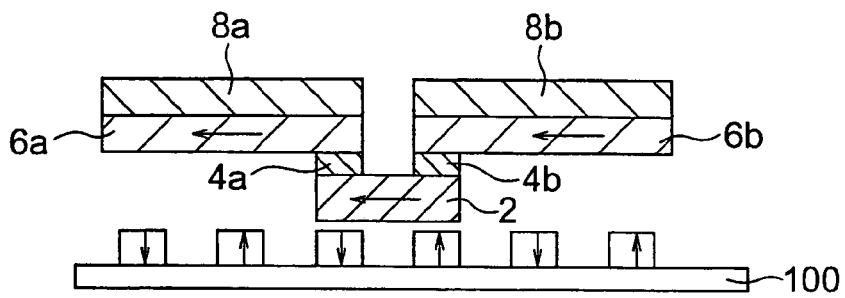
FIGS. 6A to 6D are sectional views for explaining a reproduction principle of a magneto-resistance effect element of an embodiment.
Figure 6B:
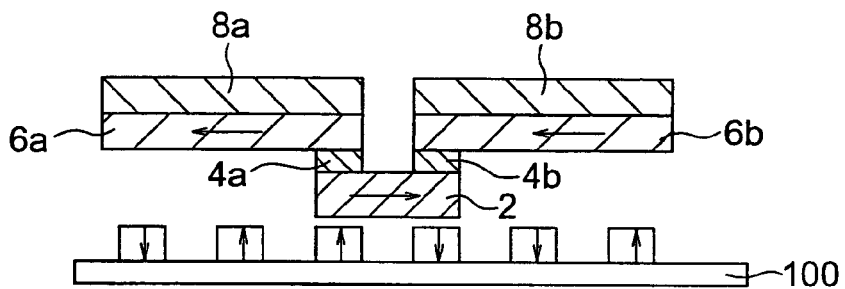
Figure 6C:
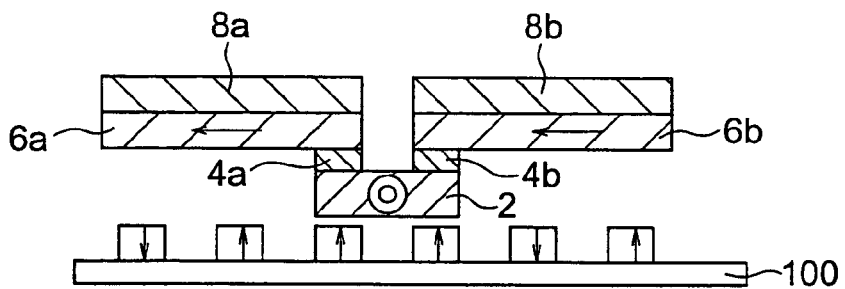
Figure 6D:
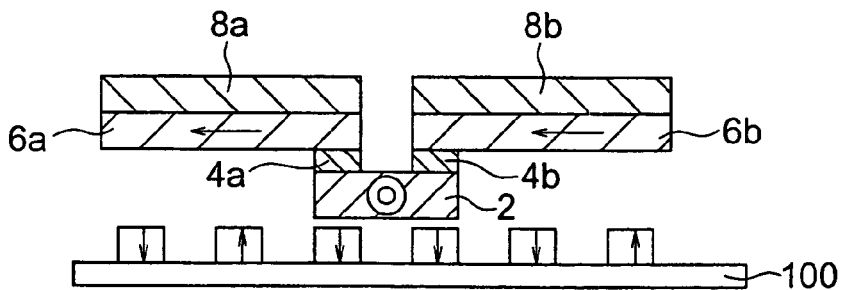

In FIG. 6A, since magnetization of the magnetization free layer 2 is directed in the same direction as the magnetization of the magnetization pinned layer 6a, 6b due to a signal magnetic field from a bit, a resistance is made small due to a CPP-MR effect and an output can be obtained. In FIG. 6B, since the magnetization of the magnetization free layer 2 is directed in a direction opposed to the magnetization of the magnetization pinned layer 6a, 6b, a resistance increases due to the CPP-MR effect and an output signal can be obtained. In FIG. 6C and FIG. 6D, since magnetization directions of two bits positioned below the magnetization free layer 2 are the same, the magnetization of the magnetization free layer 2 does not rotate and the resistance does not vary, so that any output can not be obtained.

In the head according to this embodiment, since there is not a large sensing portion of magnetic field, which is different from the head of the yoke type, a magnetism resolution is improved. Further, influence of magnetic flux from a spaced position is relatively increased according to increase in separation distance from the medium 100 in a height direction. However, since a spreading in the height direction is not provided, which is different from the head of the shield type, a resolution can be secured without using a shield.

The reproduction principle of this embodiment is different from that of the shield type, and the reproduction principle itself approximates to that of the yoke type. However, such an ideal that magnetic flux is attracted into the magneto-resistance effect element like the yoke type is not used. This embodiment is directed to solving a problem of how to make the yoke type small and a large MR ratio can be expected. The head according to this embodiment has a head shape which has been obtained by combination with the CPP-MR element and is based upon a completely novel idea.

In FIG. 6A to FIG. 6D, the operation principle in case that the patterned perpendicular medium is used as the medium 100 has been explained, but an operation similar to this operation can be obtained even when a continuous perpendicular medium is used as the medium. Further, as the operation principle of the head, the principle explained here is optimal, but it is unnecessary to limit the present invention to this principle and it is possible to use with an in-plane recording medium.

Figure 7:
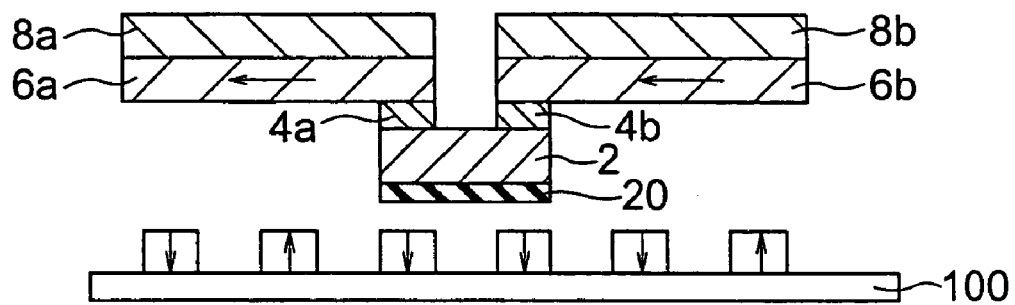
FIG. 7 is a sectional view showing a constitution of a magneto-resistance effect element according to a fifth modified embodiment.
Figure 8:
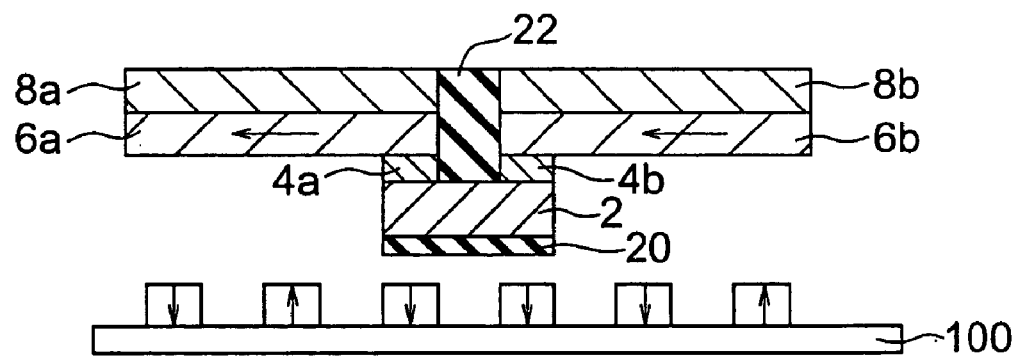
FIG. 8 is a sectional view showing a constitution of a magneto-resistance effect element according to a sixth modified embodiment.
Figure 9:
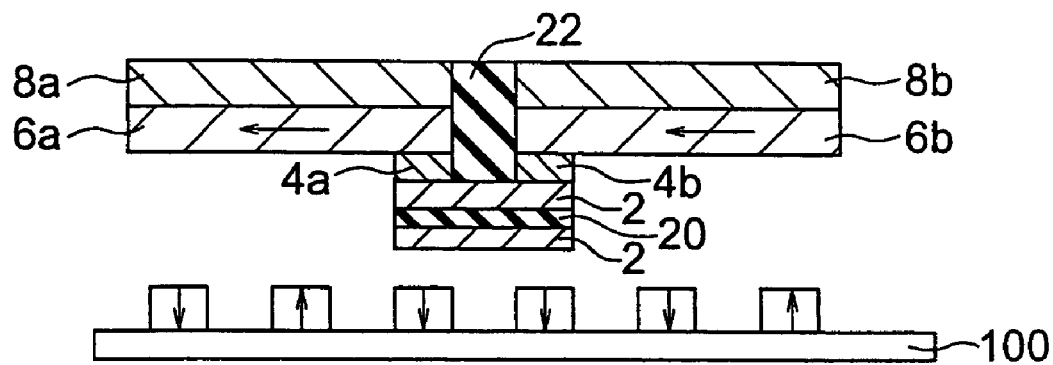
FIG. 9 is a sectional view showing a constitution of a magneto-resistance effect element according to a seventh modified embodiment.
Figure 10:
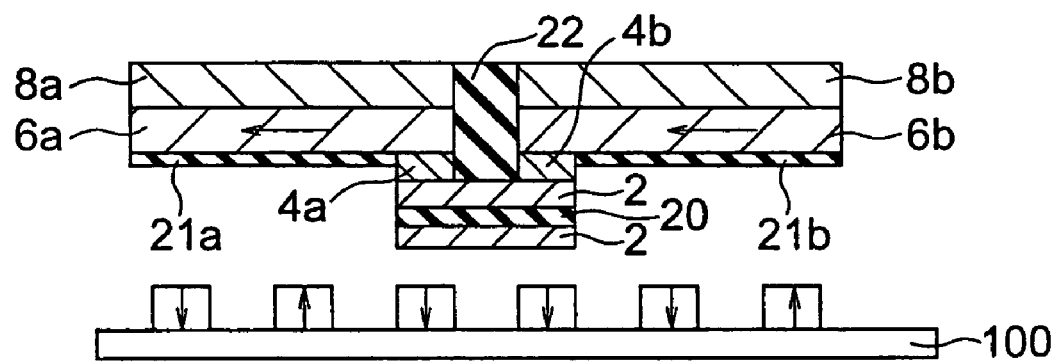
FIG. 10 is a sectional view showing a constitution of a magneto-resistance effect element according to an eighth modified embodiment.

Incidentally, in case that the CPP-spin valve effect is used as the CPP-MR element, as shown in FIG. 7, an oxide layer 20 can be stacked on the ABS of the magnetization free layer 2 directly or via Au, Ag, Cu or alloy thereof. With such a constitution, it is made possible to utilize an electron reflection effect due to the oxide film 20, the so-called a specular effect, so that an electron scattering effect on a magnetic substance surface, which does not contribute the MR ratio is suppressed and it is made possible to obtain a larger MR ratio. As shown in FIG. 8, it is also possible to form an oxide layer 22 having an electron reflection effect on an opposite side of the magnetization free layer 2 from the ABS. Further, as shown in FIG. 9, it is possible to form the oxide film 20 inside an interior of the magnetization free layer 20. As shown in FIG. 10, it is possible to further form oxide layers 21a and 21b on both surfaces of the magnetization pinned layers 6a and 6b or in interiors thereof in the magnetization pinned layers 6a and 6b like the magnetization free layer 2. Portions of the oxide layers 21a and 21 may constitute portions of protective layers for the magneto-resistance effect element.

Figure 11:
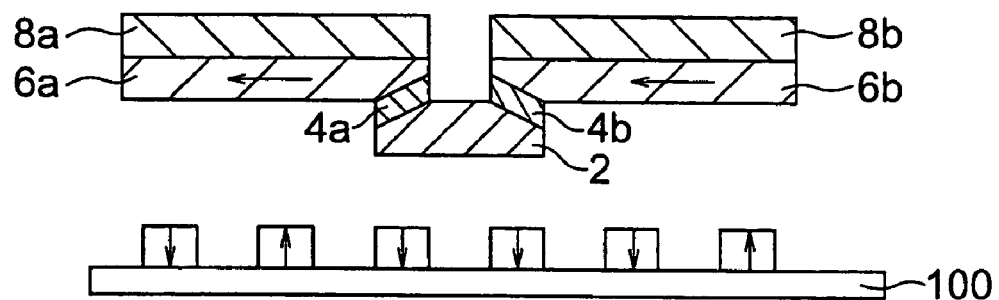
FIG. 11 is a sectional view showing a constitution of a magneto-resistance effect element according to a ninth modified embodiment.

Incidentally, as shown in FIGS. 1A and 1B, a junction face of the magnetization free layer 2 with the magnetization pinned layers 6a and 6b is not required to be parallel to a film face necessarily. That is, as shown in FIG. 11, the above-described junction faces may be inclined to the ABS. However, since the magnetization free layer 2 must be opposed to the medium 100 generally in parallel thereto, the magnetization free layer 2 must have a projection structure regarding the magnetization pinned layers 6a and 6b.

Figure 12:
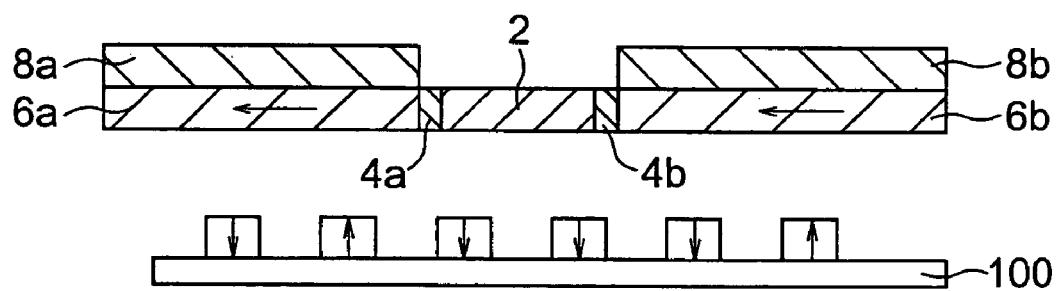
FIG. 12 is a sectional view showing a constitution of a magneto-resistance effect element according to a tenth modified embodiment.
Figure 13:
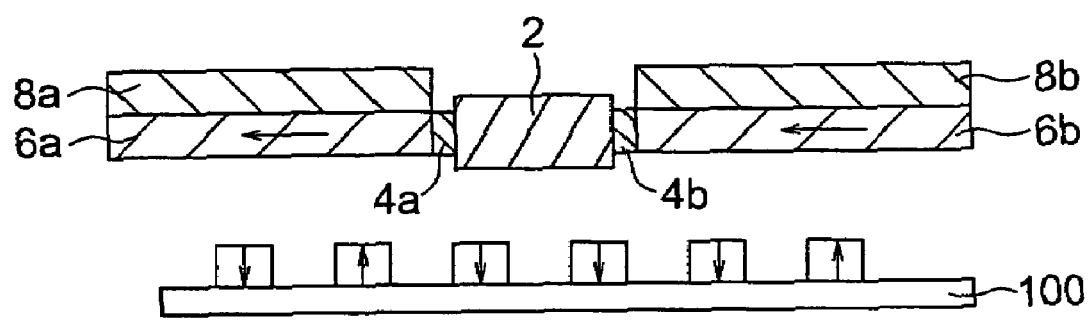
FIG. 13 is a sectional view showing a constitution of a magneto-resistance effect element according to an eleventh modified embodiment.

In case of an extreme structure, as shown in FIG. 12, such a structure can be thought that junction faces of the magnetization free layer 2 and the magnetization pinned layers 6a and 6b are formed so as to be inclined to the ABS by an angle of about 90° and intermediate layers 4a and 4b are provided between the magnetization free layer 2 and the respective magnetization pinned layers 6a and 6b. With the structure shown in FIG. 12, however, since the joined areas of the magnetization free layer 2 and the respective pinned layers 6a and 6b become extremely small, there is a possibility that a resistance becomes large excessively. Further, the magnetization free layer 2 and the magnetization pinned layers 6a and 6b become flush with each other. Incidentally, the film thicknesses of the magnetization free layers 2, the magnetization pinned layers 6a and 6b, and the intermediate layers 4a and 4b are generally the same in FIG. 12, but the film thickness of the magnetization free layer 2 may be thicker than the film thicknesses of the magnetization pinned layers 6a and 6b and the intermediate layers 4a and 4b, as shown in FIG. 13.

As explained above, according to this embodiment, sensitivity which can achieve a high recording density and an excellent error rate can be provided.

EXAMPLE 1

Electrodes 10a and 10b were first formed on a substrate, and magnetization pinned layers 6a and 6b comprising a Ta 2 nm/PtMn 10 nm/CoFe 5 nm was formed thereon. Trench with a width of 10 nm were worked by FIB processing, rectangular hole with 30 nm×30 nm was formed in a shape bridging the trench by EB lithography, and a magnetization free layer 2 comprising Cu 3 nm/CoFe 2 nm/NiFe 3 nm was formed by lift-off. Then, hard bias films 3a and 3b was formed adjacent to the magnetization free layer 2.

As a result, an element having an element resistance of 15Ω and a MR ratio of 40% could be manufactured.

Here, a method for manufacturing an element of this Example is compared with a method for manufacturing an element of a conventional shield type. In the element of the conventional shield type, it is necessary to stack upper and lower shield layers and non-magnetic layers for forming a gap and then form an ABS by a polishing technique or the like to provide a protective layer. On the other hand, in the Example, since shielding/polishing is not required, its process can be remarkably simplified. Further, in the conventional head, since a stripe height which affects output characteristics largely is determined due to polishing, control on the stripe height causes a large problem.

On the other hand, this Example has a feature that, since the formation of the magnetization free layer 2 defining a resolution is wholly performed in wafer steps such as a lithography or the like, an output and a resolution can be controlled excellently.

As explained above, according to embodiments of the present invention, sensitivity which can achieve a high recording density and an excellent error rate can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magneto-resistance effect element comprising:
   a magnetization free layer which has two opposed main surfaces, one of which is set to be generally parallel to an air bearing surface;
   an intermediate layer which is formed on an opposite side face of the magnetization free layer from a medium to come in contact with the magnetization free layer; and
   a pair of magnetization pinned layers which are formed on an opposite side face of the intermediate layer from the magnetization free layer to come in contact with the intermediate layer and extend outwardly,
   wherein a sense current flows from one magnetization pinned layer to the other magnetization pinned layer through the magnetization free layer.

2. The magneto-resistance effect element according to claim 1, wherein each magnetization pinned layer is connected with an electrode for a sense current.

3. Wherein the magnetization pinned layers have surface areas larger than the surface area of the magnetization free layer in a surface plane oriented parallel to the medium.

4. The magneto-resistance effect element according to claim 2, wherein connection positions of the magnetization free layer and the magnetization pinned layers are spaced 10 nm or more from connection positions of the magnetization pinned layers and the electrode for a sense current.

5. The magneto-resistance effect element according to claim 1, wherein anti-ferromagnetic layers are formed on opposite side faces of the magnetization pinned layers from the intermediate layer.

6. The magneto-resistance effect element according to claim 1, wherein a junction face of the magnetization free layer joining the pair of magnetization pinned layers via the intermediate layer is inclined to the air bearing surface.

7. The magneto-resistance effect element according to claim 6, wherein the junction face is inclined to the air bearing surface at about 90°.

8. The magneto-resistance effect element according to claim 7, wherein the film thickness of the magnetization free layer is thicker than those of the magnetization pinned layers.

9. The magneto-resistance effect element according to claim 1, wherein the intermediate layer is formed on only a junction face of the magnetization free layer and the magnetization pinned layers.

10. The magneto-resistance effect element according to claim 1, wherein a groove is provided between the pair of magnetization pinned layers, and a direction extending along the groove and a magnetization direction of the magnetization pinned layers cross generally perpendicularly to each other.

11. The magneto-resistance effect element according to claim 1, wherein a groove is provided between the pair of magnetization pinned layers, and a direction extending along the groove and a magnetization direction of the magnetization pinned layers are generally parallel to each other.

12. The magneto-resistance effect element according to claim 1, further comprising a first oxide layer formed on the air bearing surface of the magnetization free layer directly or via a layer comprising any one of Au, Ag and Cu, or an alloy layer of any one of Au, Ag and Cu, wherein the first oxide layer has an electron reflection effect.

13. The magneto-resistance effect element according to claim 12, further comprising a second oxide layer with an electron reflection effect which is formed on the opposite side main surface of the magnetization free layer from the air bearing surface.

14. The magneto-resistance effect element according to claim 13, further comprising a third oxide layer with an electron reflection effect which is provided on a face on which the intermediate layer of the magnetization pinned layers except for junction portion of the magnetization free layer and the magnetization pinned layers is formed.

15. The magneto-resistance effect element according to claim 1, wherein the magnetization free layer has a stacked structure in which multi-layers including an oxide layer with an electron reflection effect are stacked.

16. The magneto-resistance effect layer according to claim 1, wherein magnetization directions of the magnetization free layer and the magnetization pinned layers cross generally perpendicularly to each other.

17. The magneto-resistance effect layer according to claim 1, wherein the width of the magnetization free layer is generally coincident with a recording track width.

18. A reproducing head comprising a magneto-resistance effect element according to claim 1, wherein a distance between an air bearing surface of the head and a bottom face of the magnetization free layer is 30 nm or less.

19. A reproducing head comprising a magneto-resistance effect element according to claim 1, wherein the length of the magnetization free layer is within three times the shortest bit length in a track direction of the medium.

* * * * *